United States Patent
Mau

(10) Patent No.: US 7,773,370 B2
(45) Date of Patent: Aug. 10, 2010

(54) COMPUTER CASE FIXING MECHANISM AND COMPUTER CASE UTILIZING SAID MECHANISM

(75) Inventor: Shu-Hua Mau, Taipei (TW)

(73) Assignee: Lite-On Technology Corp., Taipei (TW)

( * ) Notice: Subject to any disclaimer, the term of this patent is extended or adjusted under 35 U.S.C. 154(b) by 126 days.

(21) Appl. No.: 12/045,689

(22) Filed: Mar. 10, 2008

(65) Prior Publication Data

US 2008/0278900 A1    Nov. 13, 2008

Related U.S. Application Data

(60) Provisional application No. 60/917,070, filed on May 10, 2007.

(51) Int. Cl.
*H05K 5/03* (2006.01)
(52) U.S. Cl. .............. 361/679.02; 361/732; 312/223.2
(58) Field of Classification Search ............ 361/679.02, 361/732; 312/223.2
See application file for complete search history.

(56) References Cited

U.S. PATENT DOCUMENTS

| | | | |
|---|---|---|---|
| 6,801,435 B1 * | 10/2004 | Su et al. | 361/747 |
| 7,325,846 B2 * | 2/2008 | Smith et al. | 292/336.3 |
| 7,568,745 B2 * | 8/2009 | Brose et al. | 292/341.15 |

* cited by examiner

*Primary Examiner*—Jayprakash N Gandhi
*Assistant Examiner*—Ingrid Wright
(74) *Attorney, Agent, or Firm*—Rosenberg, Klein & Lee

(57) ABSTRACT

A case fixing mechanism includes: a fixing device, located on a first case part; an assembling part, for containing the fixing device; a combination device, provided on the second case part; and a control device, for controlling the combination device to be in a first location or a second location. The combination device fixes the first case part and the second case part when the combination device is in the first location. The combination device enables the first case part to be separated from the second case part when the combination device is in the second location. By this mechanism, the first case part can be easily removed from the second case part in simple steps.

22 Claims, 10 Drawing Sheets

COMPUTER CASE FIXING MECHANISM AND COMPUTER CASE UTILIZING SAID MECHANISM

CROSS REFERENCE TO RELATED APPLICATIONS

This application claims the benefit of U.S. Provisional Application No. 60/917,070, filed on May 10, 2007 and entitled "COMPUTER CASE FIXING MECHANISM", the contents of which are incorporated herein by reference.

BACKGROUND OF THE INVENTION

1. Field of the Invention

The present invention relates to a case fixing mechanism and a computer case utilizing said mechanism, and particularly relates to a case fixing mechanism that requires no tools for fabrication and a computer case utilizing said mechanism.

2. Description of the Prior Art

Conventionally, a computer case includes a case cover and a case body, where the case cover requires fixing devices such as screws to fix it on the case body. However, such a structure is inconvenient for a user when fabricating the computer. For example, if a user needs to remove the case cover from the case body, some tools such as screwdrivers are required, and the fixing devices are easily lost when they are removed from the computer case. Additionally, the tools may contact circuits of the computer, causing a short, or destruction of the circuits in extreme circumstances. The cost of the screws is also an issue for a manufacturer.

Further, a user may need some force to remove the case cover from the case body or to affix the case cover to the case body, which carries the risk of injury to the user if the edges of the case cover or the case body are not processed well. In the current legal climate this is clearly something that should be prevented.

SUMMARY OF THE INVENTION

Therefore, one objective of the present invention is to provide a case fixing structure, which enables a user to easily remove the case cover from the case body without the need for fixing devices.

One embodiment of the present invention discloses a case fixing mechanism, which includes a fixing device, an assembling part, a combination device and a control device. The fixing device is located at a first case part. The assembling part is located at a second case part, for containing the fixing device. The combination device is movably located at the second case part. The control device is located at the second case part for controlling the combination device to be at a first location or a second location, wherein the combination device fixes the fixing device with the assembling part to fix the first case part and the second case part when the control device controls the combination device to be at the first location. The combination device does not fix the fixing device with the assembling part enabling the first case part to be separated from the second case part, when the control device controls the combination device to be at the second location.

Another embodiment of the present invention discloses a computer case with a case cover and a case body, which comprises a fixing device, an assembling part, a combination device and a control device. The fixing device is located at the case cover or the case body. The assembling part is located at the case cover or the case body, for containing the fixing device. The combination device is movably located at the case cover or the case body. The control device is located at the case cover or the case body, for controlling the combination device to be at a first location or a second location, wherein the combination device fixes the fixing device with the assembling part to fix the case cover or the case body when the control device controls the combination device to be at the first location. The combination device does not fix the fixing device with the assembling part enabling the case cover to be separated from the case body, when the control device controls the combination device to be at the second location. If the fixing device is located at the case cover, then the assembling part, the combination device and the control device are at the case body. If the fixing device is located at the case body, then the assembling part, the combination device and the control device are at the case cover.

Via the above-mentioned fixing mechanism and the computer case utilizing this fixing mechanism, the case cover can be easily removed from the case body without utilizing any tools. Thereby, not only does the convenience of fabricating the computer increase, but also associated costs of the computer case decrease.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
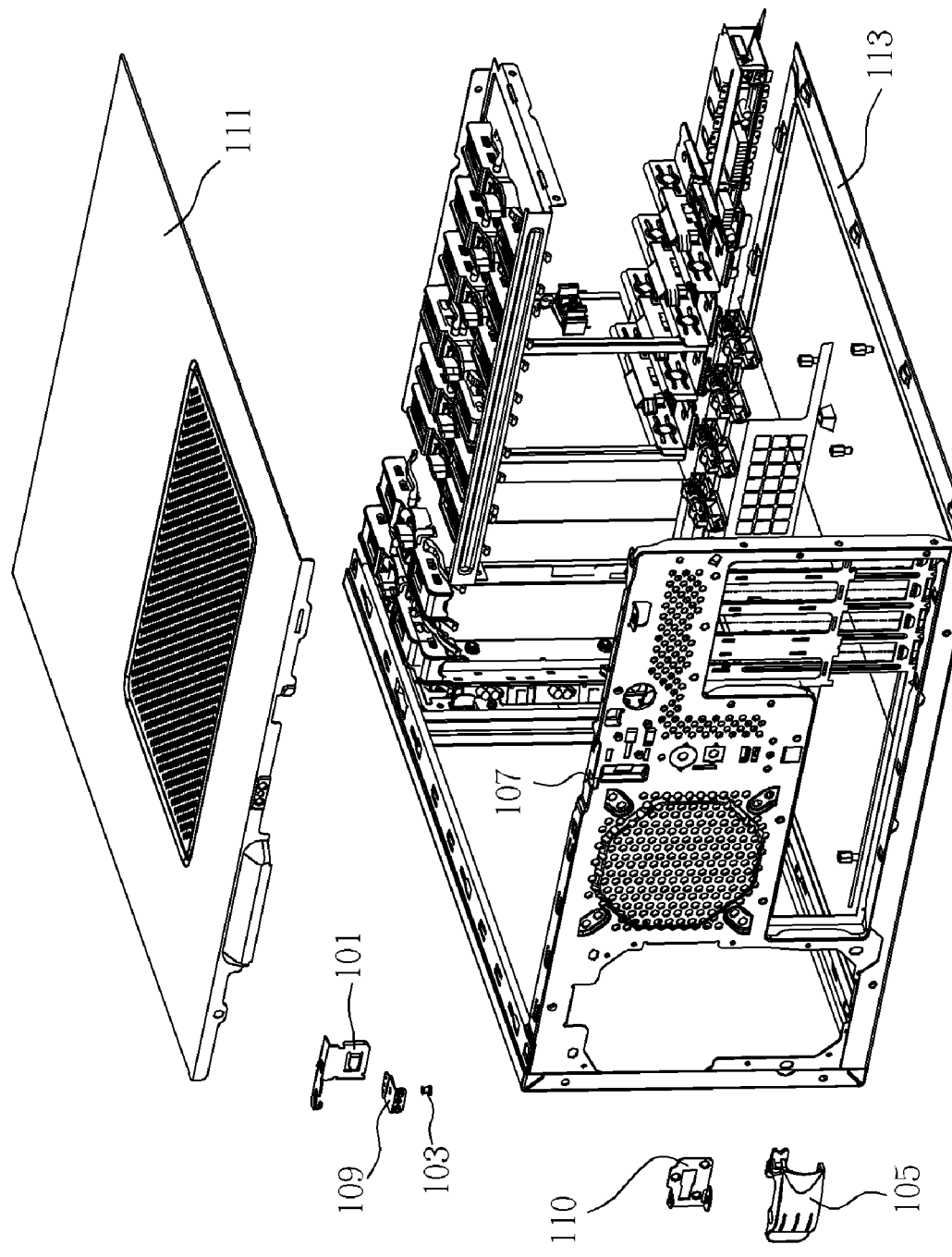
FIG. 1 is an exploded diagram illustrating the case fixing mechanism and the computer case according to the first embodiment of the present invention.

FIG. 1 is an exploded diagram illustrating the case fixing mechanism and the computer case according to the first embodiment of the present invention. As shown in FIG. 1, the case fixing mechanism according to the first embodiment of the present invention includes a combination device 101, a fixing device 103, a control device 105 and an assembling part 107. The combination device 101 is movably located at the second case part. In this embodiment, the fixing device 103 is located on the case cover 111 via an assistant component 109, and the control device 105 is located on the case body 113 via the assistant component 109. This is not meant to limit the scope of the present invention, however. The fixing device 103 and the control device 105 can be located on the case cover 111 and the case body 113 via other methods. The control device 105 is located at the case body 113 for controlling the combination device 101 to be at a first location or a second location. The combination device 101 fixes the fixing device with the assembling part 107 to fix the case cover 111 and the case body 113 when the control device 105 controls the combination device 101 to be at the first location. The combination device 101 does not fix the fixing device 103 with the assembling part 107 enabling the case cover 111 to be separated from the case body 113, when the control device 105 controls the combination device 101 to be at the second location. The assembling part 107 is used for containing the fixing device 103, and is an opening hole located at the case body 113 in this embodiment.

According to the above-mentioned description, the case fixing mechanism and the computer case according to the first embodiment can be summarized as below.

The fixing device 103 is located at the case cover 111 via the assistant component 109, the combination device 101 is located at the inner side of the case body 113, and the control device 105 is located at the case body 113 via the assistant component 109. The combination device 101 fixes the fixing device with the assembling part 107 to fix the case cover 111 and the case body 113 when the control device 105 controls the combination device 101 to be at the first location. The combination device 101 does not fix the fixing device 103 with the assembling part 107 enabling the case cover 111 to be separated from the case body 113, when the control device 105 controls the combination device 101 to be at the second location. It should be noted that the above-mentioned description is only an example and is not meant to limit the present invention. For example, the fixing device 103 can be provided at the case body 113, and the combination 101, the control device 105 and the assembling part 107 are provided at the case cover 111, thereby the same function can be reached. Additionally, the case fixing mechanism according to the first embodiment of the present invention is not limited to the computer case, and such a mechanism can be utilized in other cases.

Figure 2:
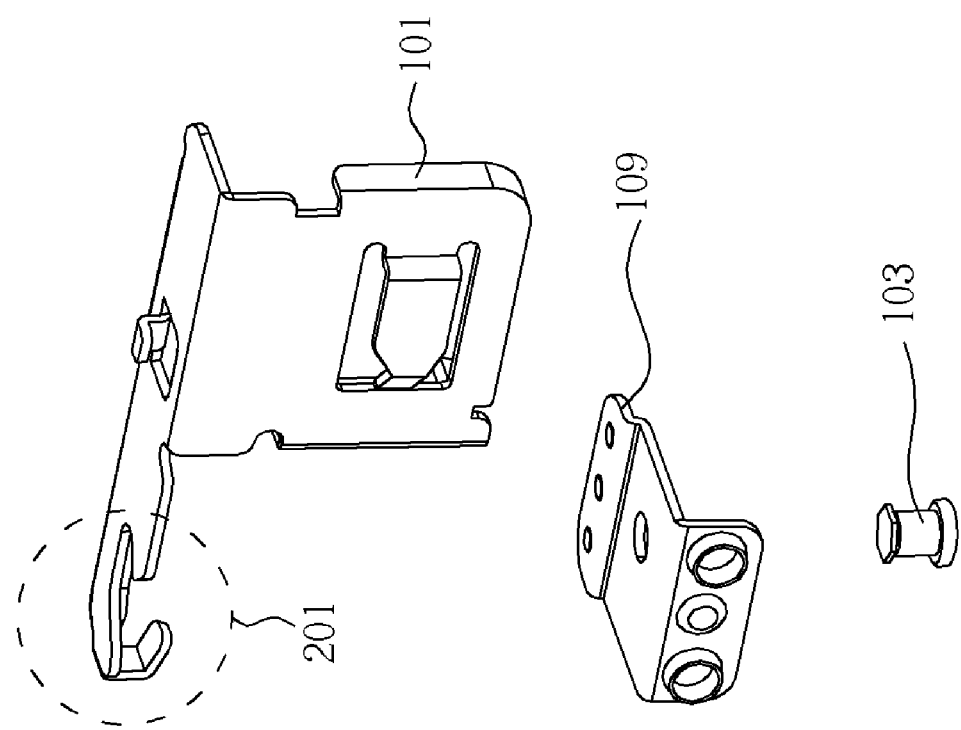
FIG. 2 is an enlarged diagram illustrating part of the devices of the case fixing mechanism according to the first embodiment of the present invention.

FIG. 2 is an enlarged diagram illustrating part of the devices of the case fixing mechanism according to the first embodiment of the present invention. As shown in FIG. 2, the diagram illustrates the combination device 101, the fixing device 103 and the assistant component 109. Also, the fixing device 103 is a pillar through the assembling part 107.

The combination device 101 includes a combination part 201, and the combination device 101 is clutched with the combination part 201 such that the case cover cannot be removed from the case body when the combination device is at the first location.

Figure 3:
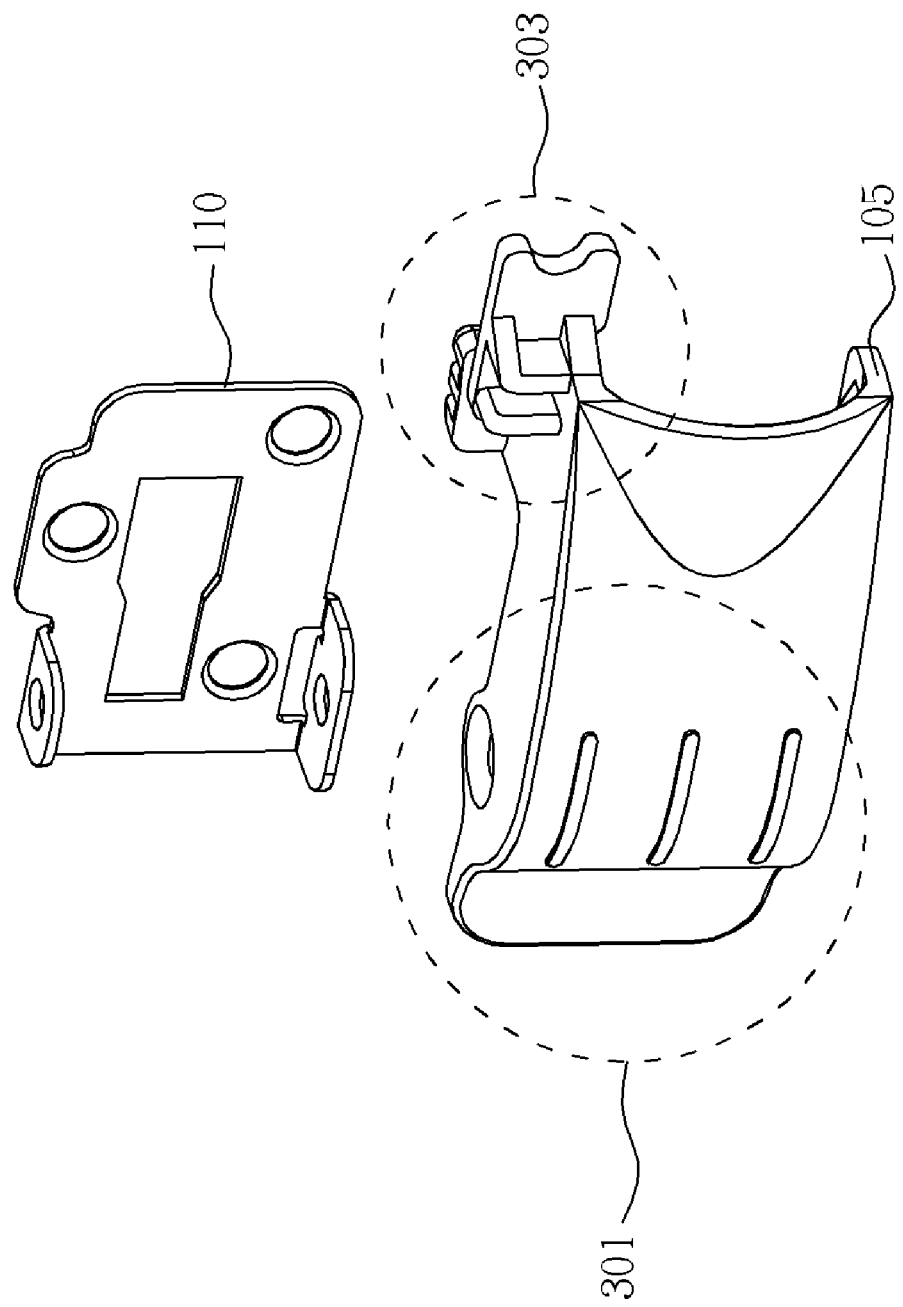
FIG. 3 is an enlarged diagram illustrating part of the devices of the case fixing mechanism according to the first embodiment of the present invention.

FIG. 3 is an enlarged diagram illustrating part of the devices of the case fixing mechanism according to the first embodiment of the present invention. As shown in FIG. 3, the diagram illustrates the control device 105 and the assistant component 110. The control device 105 includes a first part 301 located at an outer side of the case body 113 and a second part 303 located at an inner side of the case body 113. The first part 301 receives a force for driving the second part 303 to move the combination device 101 from the first position to the second position. In this embodiment, the first part 301 is a holder revolvably fixed to an outer side of the case body 113, and the second part 303 is a protruding part that is located at one end of the holder and contacts the combination device 101.

Figure 4:
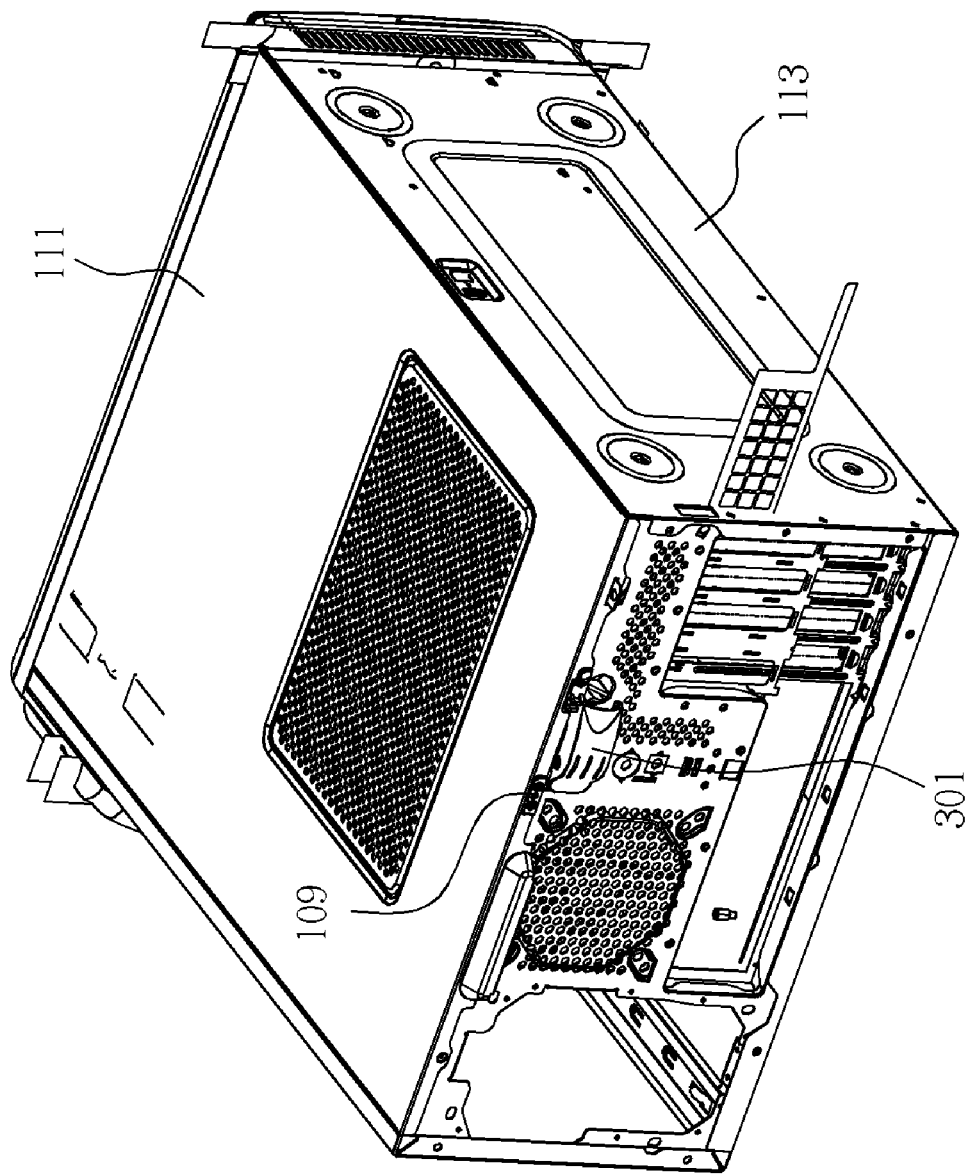
FIG. 4 is a structural diagram illustrating the case fixing mechanism according to the first embodiment located on the computer case.
Figure 5:
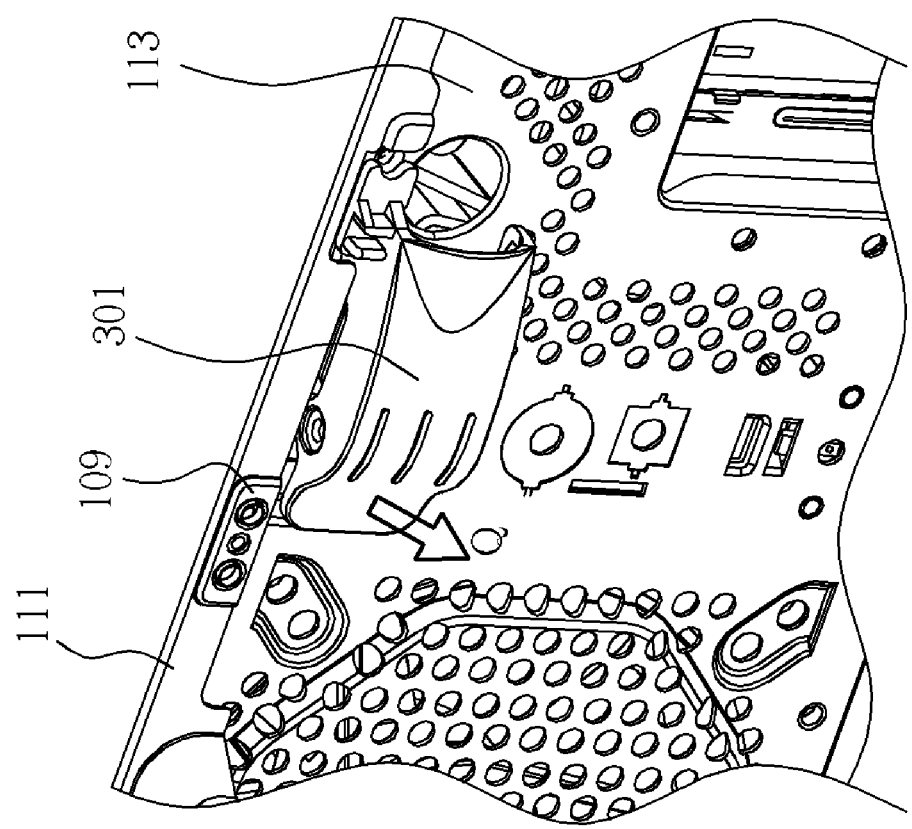
FIG. 5 is an enlarged diagram of the structural diagram of FIG. 4 illustrating the case fixing mechanism according to the first embodiment located on the computer case.

FIG. 4 is a structural diagram illustrating the case fixing mechanism located on the computer case. FIG. 5 is an enlarged diagram of the structural diagram illustrating the case fixing mechanism located on the computer case. Via these two diagrams, it is apparent that the assistant component 109 is located at the case cover, and the fixing device 103 is located at the case cover 111 via the assistant component 109. The first part 301 of the control device 105 is exposed on the case body 113, such that a user can control if the case cover 111 can be removed from the case body 113. Specifically, when the case cover 111 is fixed with the case body 113, the case body 111 can be easily removed from the case body 113 if the first part 301 is forced to move in the direction Q.

Figure 6:
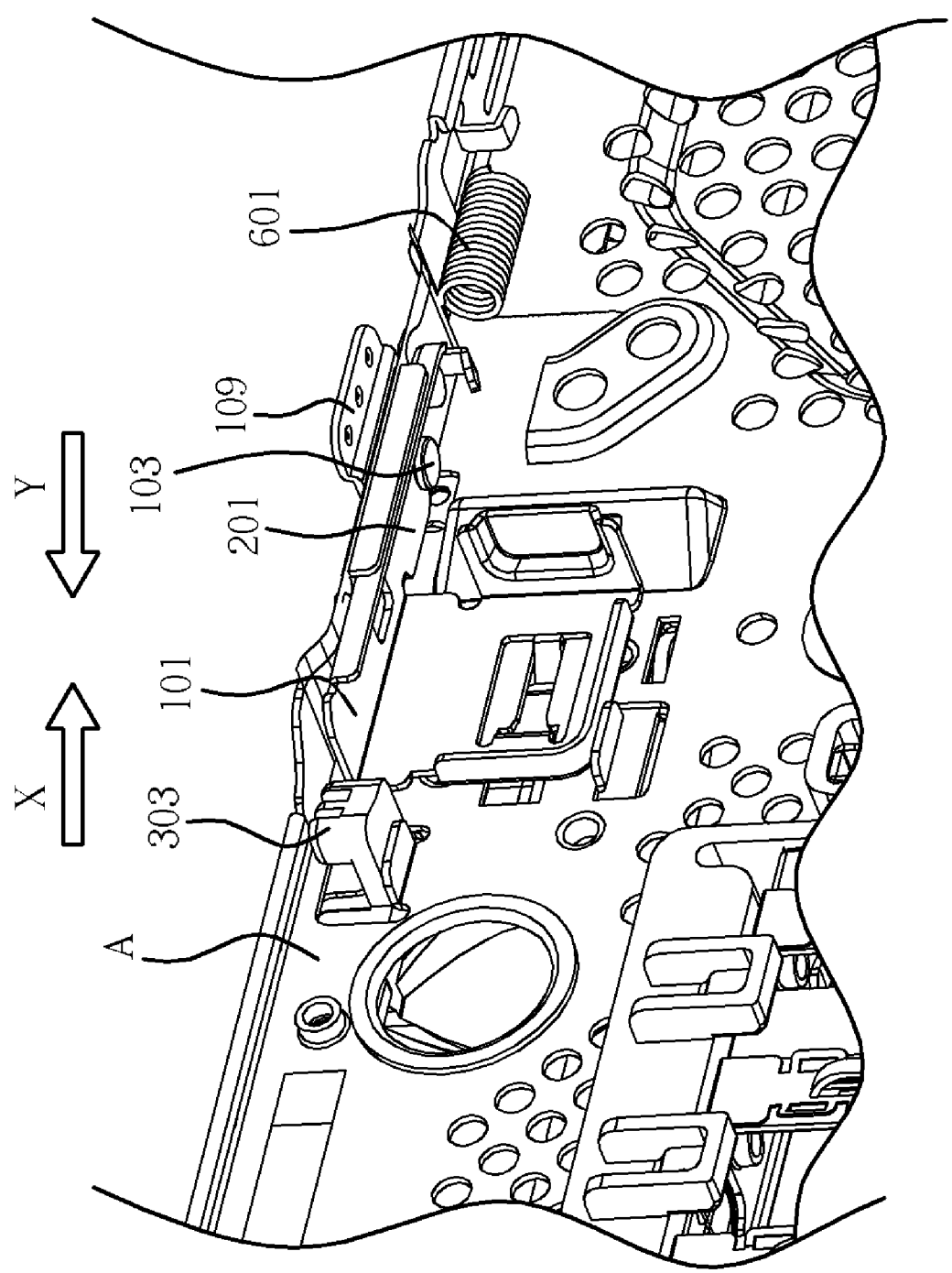
FIG. 6 is an enlarged diagram of the structural diagram from another viewpoint, wherein the structural diagram illustrates the case fixing mechanism according to the first embodiment located on the computer case.
Figure 7:
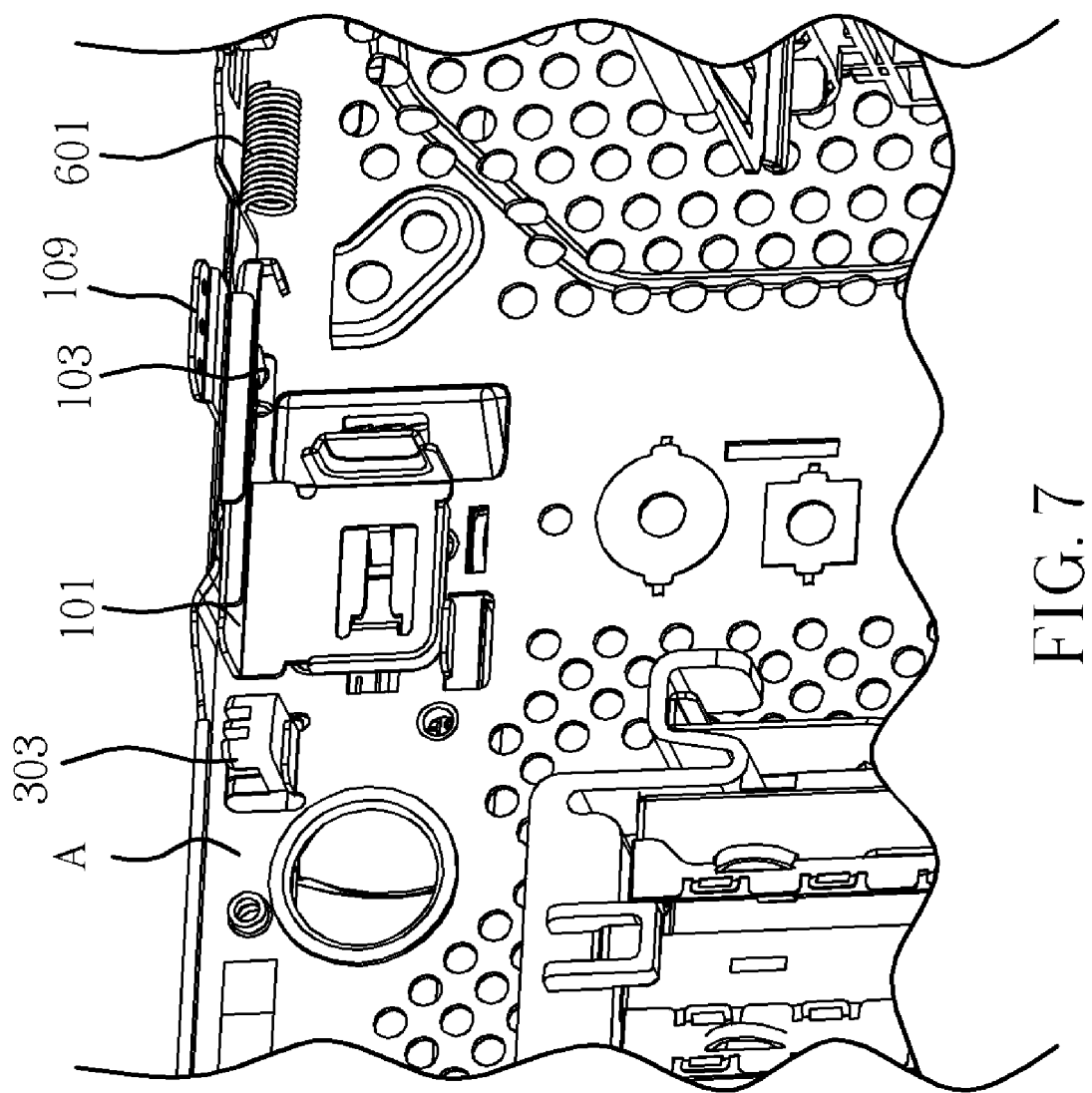
FIG. 7 is an enlarged diagram of the structural diagram from another viewpoint, wherein the structural diagram illustrates the case fixing mechanism according to the first embodiment located on the computer case.

FIG. 6 and FIG. 7 are enlarged diagrams of the structural diagram from another viewpoint, wherein the structural diagram illustrates the case fixing mechanism according to the first embodiment located on the computer case. Via FIG. 6 and FIG. 7, the relation between the combination device 101, the fixing device 103, the assistant component 109 and the second part 303 of the control device 105 can be clearly shown. FIG. 6 and FIG. 7 illustrate the situation that the combination device is at the first location. In this case, the fixing device 103 is clutched with the combination part 201 of the combination device 101, such that the case cover cannot be separated from the case body. The second part 303 moves in direction X and pushes the combination device 101 when the first part 301 of the control device 105 is forced to move in direction Q as shown in FIG. 5, such that the fixing device 103 is not clutched with the combination part 201 and the case cover can be removed from the case body.

It should be noted that the case fixing mechanism according to the present invention can further include a recovery device 601 connected to the combination device 101, as shown in FIGS. 6 and 7. After the control device 105 delivers a force to drive the combination device 101 to move from the first location to the second location, the recovery device 601 drives the combination device 101 to recover from the second location to the first location (that is, in direction Y) if the control device 105 no longer provides any force. The recovery device 601 can be an elastic device such as a spring, and it provides a push force to drive the combination device to recover from the second location to the first location if it is located at the locations shown in FIGS. 6 and 7. However, the recovery 601 can be at the location A shown in FIGS. 6 and 7, and the recovery device 601 provides a pull force to drive the combination device 101 to recover from the second location to the first location in this case.

Figure 8:
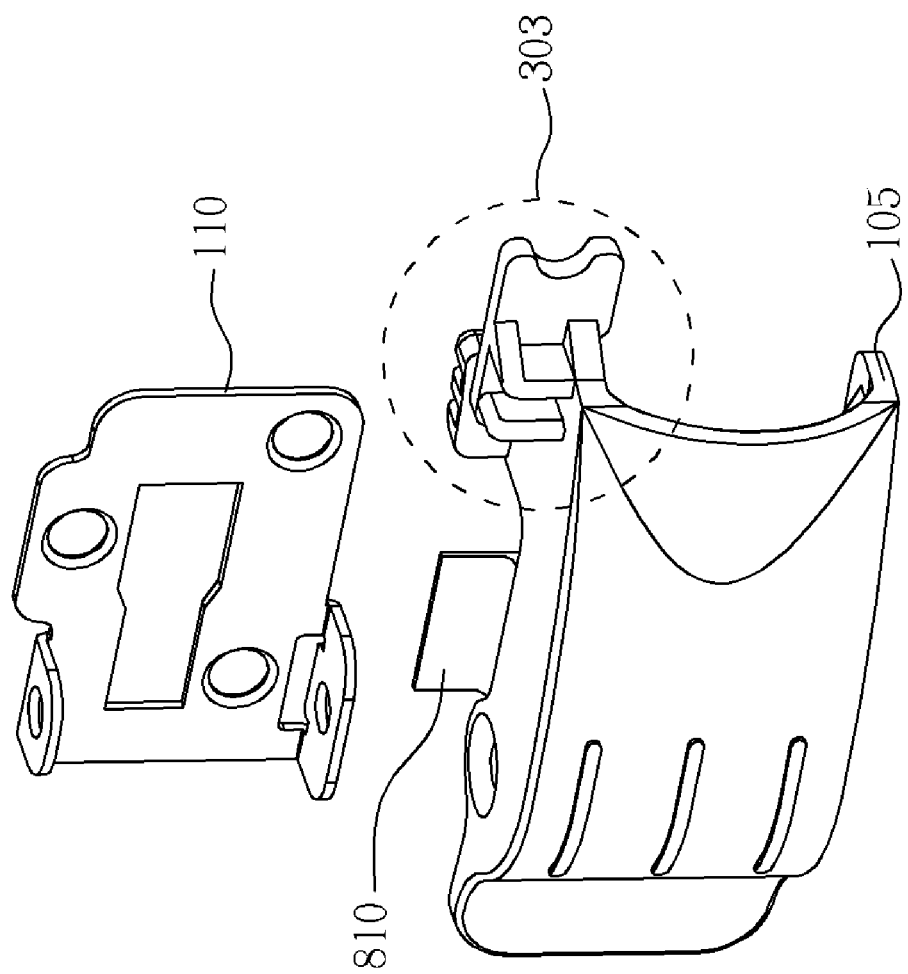
FIG. 8 is an enlarged diagram illustrating part of the devices of the case fixing mechanism according to a second embodiment of the present invention.
Figure 9:
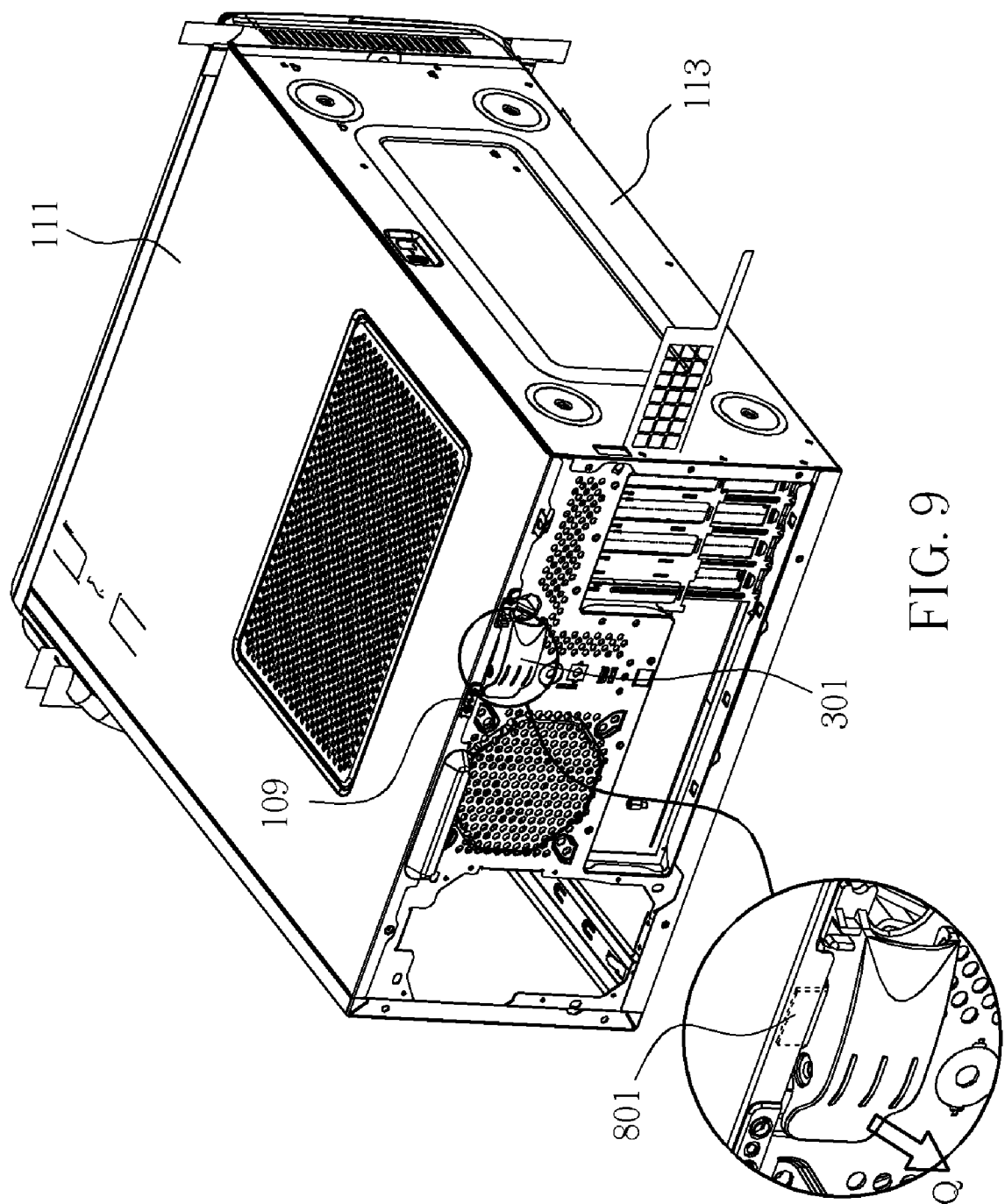
FIG. 9 is a structural diagram illustrating the case fixing mechanism according to the second embodiment located on the computer case.
Figure 10:
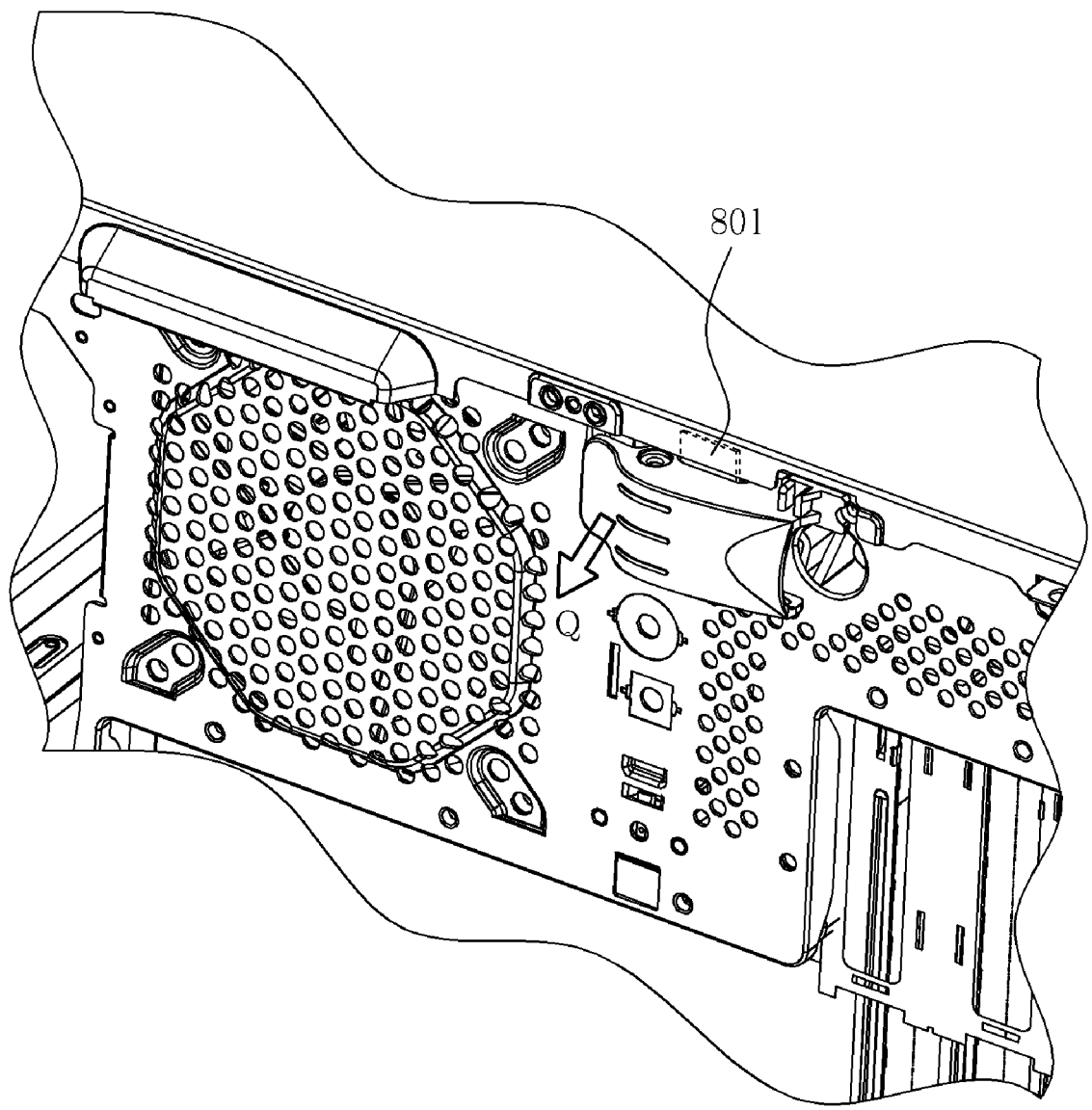
FIG. 10 is an enlarged diagram of the structural diagram illustrating the case fixing mechanism according to the second embodiment located on the computer case.

FIG. 8 is an enlarged diagram illustrating part of the devices of the case fixing mechanism according to the second embodiment of the present invention. FIG. 9 is a structural diagram illustrating the case fixing mechanism according to the second embodiment located on the computer case. Please jointly refer to FIGS. 8 and 9 to understand the second embodiment of the present invention more clearly. Compared with the first embodiment shown in FIG. 3 and the second embodiment shown in FIG. 8, the second embodiment shown in FIG. 8 further includes an assistant piece 801. A perspective view is illustrated in FIG. 9; please note that the assistant piece 801 is located between the case cover 111 and the case body 113 but not exposed on the case cover 111. If the first part 301 of the control device is forced to move in direction Q, the assistant piece 801 can provide a push force in the Q direction to the case cover 111. The assistant piece 801 can push the case cover 111 to remove it from the case body 113 when a user turns the control device to make the case cover 111 not fixed with the case body 113, thereby the case cover 111 can be easily removed from the case body 113. FIG. 10 is an enlarged diagram of the structural diagram illustrating the case fixing mechanism according to the second embodiment located on the computer case. The relation between the assistant piece 801 and the surrounding devices can be easily understood via FIG. 10.

The above-mentioned fixing structure and the computer case utilizing the fixing structure enables the case cover to be removed from the case body in simple steps without utilizing any tools. Not only does the convenience of fabricating a computer increase, but also associated costs of the computer case decrease.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A case fixing mechanism, including:
   a fixing device, located at a first case part and displaceable with said first case part;
   an assembling part, located at a second case part, for containing the fixing device;
   a combination device, movably located at the second case part to engage or disengage the fixing device on the first case part with the assembling part on the second case part; and
   a control device, located at the second case part, for controlling the combination device to be at a first location or a second location, the control device further connected to an assistant component, and the assistant component being disposed on the second case part;
   wherein the combination device interlocks the fixing device with the assembling part to combine the first case part and the second case part when the control device controls the combination device to be at the first location, and when the control device controls the combination device to be at the second location, the combination device does not interlock the fixing device with the assembling part thus enabling the first case part to be separable from the second case part.

2. The case fixing mechanism of claim 1, wherein the first case part is a case cover, and the second case part is a case body.

3. The case fixing mechanism of claim 1, wherein the first case part is a case body, and the second case part is a case cover.

4. The case fixing mechanism of claim 1, further comprising:
   a recovery device, connected to the combination device;
   wherein the control device is utilized to deliver a force for driving the combination device to move from the first location to the second location, and the recovery device is for recovering the combination device so the combination device moves from the second location to the first location when the control device does not provide the force.

5. The case fixing mechanism of claim 4, wherein the control device includes a first part located at an outer side of the second case part and a second part located at an inner side of the second case part, where the first part receives the force for driving the second part to move the combination device from the first position to the second position.

6. The case fixing mechanism of claim 5, wherein the first part is a holder revolvably fixed to an outer side of the second case part, and the second part is a protruding part that is located at one end of the holder and contacts the combination device.

7. The case fixing mechanism of claim 4, wherein the recovery device provides a push force to make the combination device recover from the second location to the first location.

8. The case fixing mechanism of claim 4, wherein the recovery device provides a pull force to make the combination device recover from the second location to the first location.

9. The case fixing mechanism of claim 4, wherein the recovery device is an elastic device.

10. The case fixing mechanism of claim 1, wherein the assembling part is an opening hole on the second case part, and the fixing device is a pillar through the opening hole.

11. The case fixing mechanism of claim 10, wherein the combination device includes a combination part, and the pillar is clutched with the combination part when the combination device is at the first location.

12. The case fixing mechanism of claim 1, wherein the control device further includes an assistant piece extending between the first case part and the second case part, for pushing the first case part to depart from the second case part when the control device controls the combination device to be at the second position.

13. A computer case with a case cover and a case body and displaceable with said case cover or said case body; comprising:
   a fixing device, located at the case cover or the case body;
   an assembling part, located at the case cover or the case body, for containing the fixing device;
   a combination device, movably located at the case cover or the case body to engage or disengage the fixing device on the case cover or the case body with the assembling part on the case cover or the case body; and
   a control device, located at the case cover or the case body, for controlling the combination device to be at a first location or a second location, wherein the combination device interlocks the fixing device with the assembling part to combine the case cover or the case body when the control device controls the combination device to be at the first location, the combination device does not interlock the fixing device with the assembling part enabling the case cover to be separated from the case body, when the control device controls the combination device to be at the second location, the control device further connected to an assistant component, and the assistant component being disposed on the case cover or the case body;
   wherein if the fixing device is located at the case cover, then the assembling part, the combination device and the control device are at the case body, and if the fixing device is located at the case body, then the assembling part, the combination device and the control device are at the case cover.

14. The computer case of claim 13, further comprising:
   a recovery device, connected to the combination device;
   wherein the control device is utilized to deliver a force for driving the combination device to move from the first location to the second location, and the recovery device is for recovering the combination device so the combination device moves from the second location to the first location when the control device does not provide the force.

15. The computer case of claim 14, wherein the control device includes a first part located at an outer side of the case body and a second part located at an inner side of the case body, where the first part receives the force to drive the second part to move the combination device from the first position to the second position.

16. The computer case of claim 15, wherein the first part is a holder revolvably fixed to an outer side of the case body, and the second part is a protruding part that is located at one end of the holder and contacts the combination device.

17. The computer case of claim 14, wherein the recovery device provides a push force to make the combination device recover from the second location to the first location.

18. The computer case of claim 14, wherein the recovery device provides a pull force to make the combination device recover from the second location to the first location.

19. The computer case of claim 14, wherein the recovery device is an elastic device.

20. The computer case of claim 13, wherein the assembling part is an opening hole on the case body, and the fixing device is a pillar through the opening hole.

21. The computer case of claim 20, wherein the combination device includes a combination part, and the pillar is clutched with the combination part when the combination device is at the first location.

22. The computer case of claim 13, wherein the control device further includes an assistant piece extending between the first case part and the second case part, for pushing the case cover to depart from the case body when the control device controls the combination device to be at the second position.

* * * * *